United States Patent
Wang

(10) Patent No.: US 7,388,430 B2
(45) Date of Patent: Jun. 17, 2008

(54) ENHANCED DIGITAL PREDISTORTION

(75) Inventor: Robert Chuenlin Wang, Randolph, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 92 days.

(21) Appl. No.: 11/475,156

(22) Filed: Jun. 27, 2006

(65) Prior Publication Data

US 2007/0296493 A1     Dec. 27, 2007

(51) Int. Cl.
*H03F 1/26* (2006.01)
(52) U.S. Cl. .................................. 330/149; 330/136
(58) Field of Classification Search ........... 330/149, 330/136
See application file for complete search history.

(56) References Cited

U.S. PATENT DOCUMENTS

| | | | |
|---|---|---|---|
| 6,054,894 A * | 4/2000 | Wright et al. | 330/149 |
| 6,240,278 B1 * | 5/2001 | Midya et al. | 455/126 |
| 6,294,956 B1 * | 9/2001 | Ghanadan et al. | 330/124 R |
| 7,026,871 B2 * | 4/2006 | Saed | 330/149 |
| 7,248,656 B2 * | 7/2007 | da Silveira et al. | 375/346 |
| 7,286,009 B2 * | 10/2007 | Andersen et al. | 330/10 |

* cited by examiner

*Primary Examiner*—Patricia Nguyen

(57) ABSTRACT

In one embodiment of the present invention, a weight vector is generated based on a pre-distorted input signal and an output signal of an amplifier using a computation reduction technique. The computation reduction technique decomposes a number of multiplication operations between complex numbers such that a number of multiplications and a number of additions to generate the weight vector is reduced as compared to if the number of multiplication operations between complex numbers was not decomposed. An input signal for input to an amplifier is pre-distorted based on the generated weight vector.

17 Claims, 3 Drawing Sheets

ENHANCED DIGITAL PREDISTORTION

BACKGROUND OF THE INVENTION

The present invention provides a methodology to improve digital pre-distortion for correcting amplifier distortion.

FIG. 1 illustrates the prior art architecture for digital pre-distortion to correct amplifier distortion. As shown, an input signal (e.g., a radio frequency (RF) input signal) is input to a pre-distorter 10. The pre-distorter 10 multiplies the input signal with complex weight vector w supplied by a weight estimator 12. The pre-distorted input signal d(n) is supplied to an amplifier 14, which amplifies the pre-distorted input signal d(n) to obtain an output signal x(n) (e.g., an RF output signal) corrected for amplifier distortion.

The weight estimator 12 models the amplifier distortion as a least-squares estimation problem with multi-channels and equal weight lengths. The weight estimator 12 collects digital samples at both the input and output of the amplifier and estimates the parameters of the amplifier non-linear distortion model. With these modeled parameters, the weight estimator 12' generates weights that the pre-distorter 10 uses to pre-distort the input signal to counter the amplifier distortions.

Operation of the weight estimator 12 will now be described in greater detail. As shown in FIG. 1, d(n) denotes the amplifier (complex) input signal and x(n) denotes the amplifier (complex) output signal, at time n.

The amplifier output signal x(n) is expanded into a column vector of K=5 magnitude-polynomial terms or multi-channels, to model the amplifier nonlinearity distortion:

$$\underline{x}(n) = \begin{bmatrix} x(n) \\ |x(n)|x(n) \\ |x(n)|^2 x(n) \\ |x(n)|^3 x(n) \\ |x(n)|^4 x(n) \end{bmatrix} = \begin{bmatrix} 1 \\ |x(n)| \\ |x(n)|^2 \\ |x(n)|^3 \\ |x(n)|^4 \end{bmatrix} x(n)$$

Note that variables are underscored or bolded to represent a vector or matrix. $x^H(n)$ is used to denote the conjugate transpose of vector $\underline{x}(\overline{n})$ and $x^T(n)$ is used to denote the transpose of vector $\underline{x}(n)$. Also, $x^*(n)$ is used to denote the complex conjugate of x(n).

The amplifier output signal x(n) is a complex number whereas the magnitude-polynomial multipliers are positive real numbers. This means that these K=5 terms in vector $\underline{x}(n)$ are the scaled versions of the amplifier output signal $x(\overline{n})$.

FIG. 2 illustrates the scaled relationship of the 5 elements in vector $\underline{x}(n)$, where x(n)=0.2+i0.8. To model the amplifier distortion, the impact of all the L=6 delayed versions of $\underline{x}(n)$ is considered, including the vector $\underline{x}(n)$ itself as shown below:

$$\underline{x}(n-l) = \begin{bmatrix} x(n-l) \\ |x(n-l)|x(n-l) \\ |x(n-l)|^2 x(n-l) \\ |x(n-l)|^3 x(n-l) \\ |x(n-l)|^4 x(n-l) \end{bmatrix} = \begin{bmatrix} 1 \\ |x(n-l)| \\ |x(n-l)|^2 \\ |x(n-l)|^3 \\ |x(n-l)|^4 \end{bmatrix} x(n-l),$$

$l = 0, 1, \ldots, L-1.$

Here, K=5 is the number of multi-channels (or magnitude-polynomial terms) and L=6 is the total number of delayed versions in each multi-channel. As each of these terms has an associated complex weight (or coefficient) multiplier, the total number of weights is M=KL=30. The cross-polynomial term will be considered below.

These 6 vectors are concatenated into an M×1 vector, as the multi-channel vector u(n) for the least-square estimation model, and a corresponding M×1 weight vector w as shown below:

$$\underline{u}(n) = \begin{bmatrix} \underline{x}(n) \\ \underline{x}(n-1) \\ \underline{x}(n-2) \\ \underline{x}(n-3) \\ \underline{x}(n-4) \\ \underline{x}(n-5) \end{bmatrix} = \begin{bmatrix} u_1(n) \\ u_2(n) \\ u_3(n) \\ u_4(n) \\ \vdots \\ u_{M-1}(n) \\ u_M(n) \end{bmatrix} \text{ and } \underline{w} = \begin{bmatrix} w_1 \\ w_2 \\ w_3 \\ w_4 \\ \vdots \\ w_{M-1} \\ w_M \end{bmatrix}.$$

Notice that output signal vector u(n) can be expressed in two ways, either in terms of magnitude-polynomial vectors $\underline{x}$(n-l) or individual elements $u_i$(n).

The estimate of the desired amplifier input signal, at time n, is given as:

$$\underline{w}^T \cdot \underline{u}(n) = \sum_{i=1}^{M} w_i \cdot u_i(n).$$

The least-squares estimation problem is to find the optimal weights w that minimize the sum of error squares, given N pairs of actual amplifier input signal d(n) and vector u(n), n=1, 2, ..., N:

$$\sum_{n=1}^{N} |d(n) - \underline{w}^T \cdot \underline{u}(n)|^2 = \sum_{n=1}^{N} \left| d(n) - \sum_{i=1}^{M} w_i \cdot u_i(n) \right|^2$$

The optimal weights solution for the least-squares estimation problem satisfies the following matrix equation:

$$\underline{w}_{LS} = \underline{R}^{-1} \cdot \underline{v}$$

where R is the M×M correlation matrix and v is the M×1 cross-correlation vector defined as:

$$\underline{R} = \sum_{n=1}^{N} \underline{R}(n)$$

where $$\underline{R}(n) = \underline{u}(n) \cdot \underline{u}^H(n) \text{ and } \underline{v} = \sum_{n=1}^{N} \underline{v}(n)$$

where $$\underline{v}(n) = d(n) \cdot \underline{u}(n).$$

From the definition of the correlation matrix, it can be seen that matrix $\underline{R}(n) = \lfloor r_{i,j}(n) \rfloor$ is symmetric, i.e., $r_{i,j}(n) = r^*_{i,j}(n)$, $1 \leq i,j \leq M$. Accordingly, as is well-known only the upper triangular elements need to be computed and then used for the other elements. The total number of elements is 465 (=M·(M+1)/2) out of 900 elements.

Since the vector $\underline{u}(n)$ consists of 6 delayed versions of vector $\underline{x}(n)$, so do the correlation matrix and cross-correlation vector. The correlation matrix can be divided into the following 6×6 blocks of correlation values:

$$\underline{R}(n) = \begin{bmatrix} \underline{R}_{1,1}(n) & \underline{R}_{1,2}(n) & \underline{R}_{1,3}(n) & \underline{R}_{1,4}(n) & \underline{R}_{1,5}(n) & \underline{R}_{1,6}(n) \\ \underline{R}_{2,1}(n) & \underline{R}_{2,2}(n) & \underline{R}_{2,3}(n) & \underline{R}_{2,4}(n) & \underline{R}_{2,5}(n) & \underline{R}_{2,6}(n) \\ \underline{R}_{3,1}(n) & \underline{R}_{3,2}(n) & \underline{R}_{3,3}(n) & \underline{R}_{3,4}(n) & \underline{R}_{3,5}(n) & \underline{R}_{3,6}(n) \\ \underline{R}_{4,1}(n) & \underline{R}_{4,2}(n) & \underline{R}_{4,3}(n) & \underline{R}_{4,4}(n) & \underline{R}_{4,5}(n) & \underline{R}_{4,6}(n) \\ \underline{R}_{5,1}(n) & \underline{R}_{5,2}(n) & \underline{R}_{5,3}(n) & \underline{R}_{5,4}(n) & \underline{R}_{5,5}(n) & \underline{R}_{5,6}(n) \\ \underline{R}_{6,1}(n) & \underline{R}_{6,2}(n) & \underline{R}_{6,3}(n) & \underline{R}_{6,4}(n) & \underline{R}_{6,5}(n) & \underline{R}_{6,6}(n) \end{bmatrix}$$

Block $\underline{R}_{i,j}(n)$ is a 5×5 correlation matrix between vectors $\underline{x}(n-i+1)$ and $\underline{x}(n-j+1)$ such as expressed below:

$$\underline{R}_{i,j}(n) = \underline{x}(n-i+1) \cdot \underline{x}^H(n-j+1), \; 1 \leq i,j \leq 5.$$

Most of the elements in matrix $\underline{R}(n)$ are the same as elements in matrix $\underline{R}(n-1)$, as shown below:

$$\underline{R}_{i+1,j+1}(n) = \underline{R}_{i,j}(n-1), \; 1 \leq i,j \leq 5.$$

This is illustrated graphically in FIG. 3.

The new elements in $\underline{R}(n)$ that are not included in $\underline{R}(n-1)$ are the top row of blocks and the left most column of blocks. The top row of blocks is:

$$\underline{x}(n) \cdot \underline{u}^H(n) = [\underline{R}_{1,1}(n) \underline{R}_{1,2}(n) \underline{R}_{1,3}(n) \underline{R}_{1,4}(n) \underline{R}_{1,5}(n) \underline{R}_{1,6}(n)].$$

The first block $\underline{R}_{1,1}(n)$ is a diagonal block with symmetric elements and the remaining blocks are off-diagonal blocks. Hence, only the 140 elements in the first block $\underline{R}_{1,1}(n)$ need to be computed.

From the symmetry property, only the 21 upper triangular blocks need to be considered. These blocks can be grouped into 2 types, diagonal and off-diagonal blocks, where the blocks in each type have the same structure as set forth in table 1 below:

TABLE 1

| Type # | Blocks in this type | Dim | # | Example Expression |
|---|---|---|---|---|
| 1 | Diagonal blocks: $R_{1,1}(n), \ldots, R_{6,6}(n)$ | 5 × 5 | 6 | $R_{1,1}(n) = \underline{x}(n) \cdot \underline{x}^H(n)$ |
| 2 | Off-diagonal blocks: $R_{1,2}(n), \ldots, R_{5,6}(n)$ | 5 × 5 | 15 | $R_{1,2}(n) = \underline{x}(n) \cdot \underline{x}^H(n-1)$ |

The symmetry property may be used to compute only 465 elements of the correlation matrix out of 900 elements. Each correlation value is computed using complex-complex multiplication with 4-multiplications and 2-additions. The complexity is summarized in table 2 below:

TABLE 2

| Operations | #Mult | #Add |
|---|---|---|
| 465 complex-complex multiplications | 1860 | 930 |

Also, the delayed version property may be used to reduce the computation complexity where only 140 correlation values are computed. Each correlation value is computed using complex-complex multiplication with 4-multiplications and 2-additions. The complexity is summarized in table 3 below:

TABLE 3

| Operations | #Mult | #Add |
|---|---|---|
| 140 complex-complex multiplications | 560 | 280 |

SUMMARY OF THE INVENTION

The present invention relates to amplifier predistortion.

In one embodiment of the present invention, a weight vector is generated based on a pre-distorted input signal and an output signal of an amplifier using a computation reduction technique. The computation reduction technique decomposes a number of multiplication operations between complex numbers such that a number of multiplications and a number of additions to generate the weight vector is reduced as compared to if the number of multiplication operations between complex numbers was not decomposed. An input signal for input to an amplifier is pre-distorted based on the generated weight vector.

BRIEF DESCRIPTION OF THE DRAWINGS

The present invention will become more fully understood from the detailed description given herein below and the accompanying drawings, wherein like elements are represented by like reference numerals, which are given by way of illustration only and thus are not limiting of the present invention and wherein.

DETAILED DESCRIPTION OF EXAMPLE EMBODIMENTS

Figure 1:
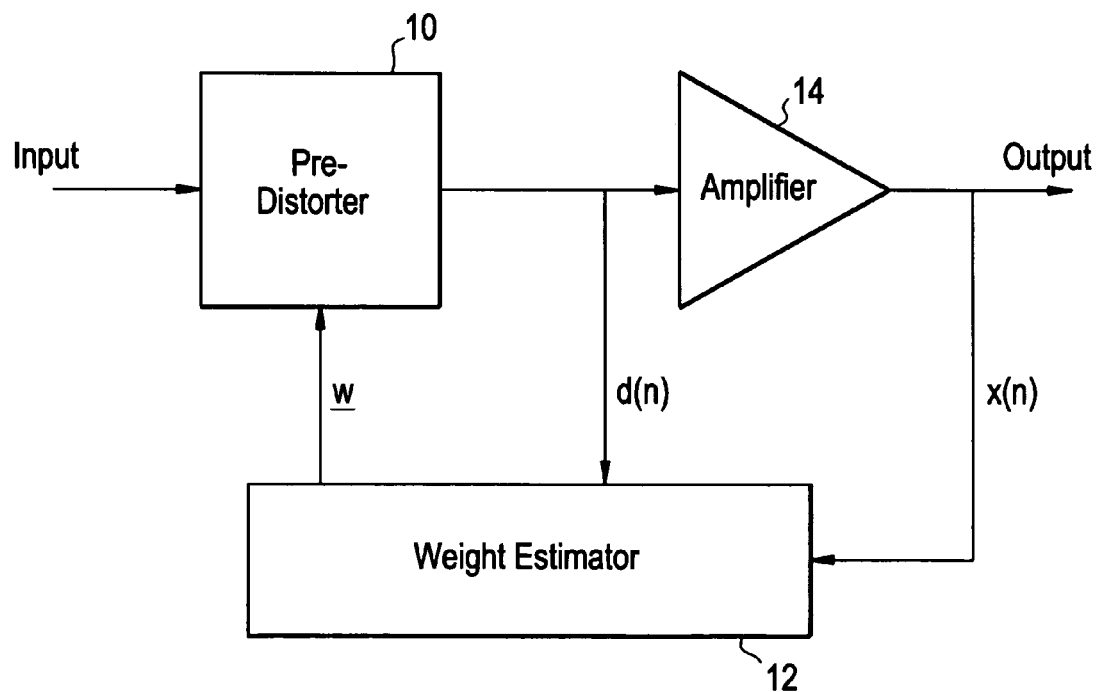
FIG. 1 illustrates the prior art architecture for digital predistortion to correct amplifier distortion.
Figure 2:
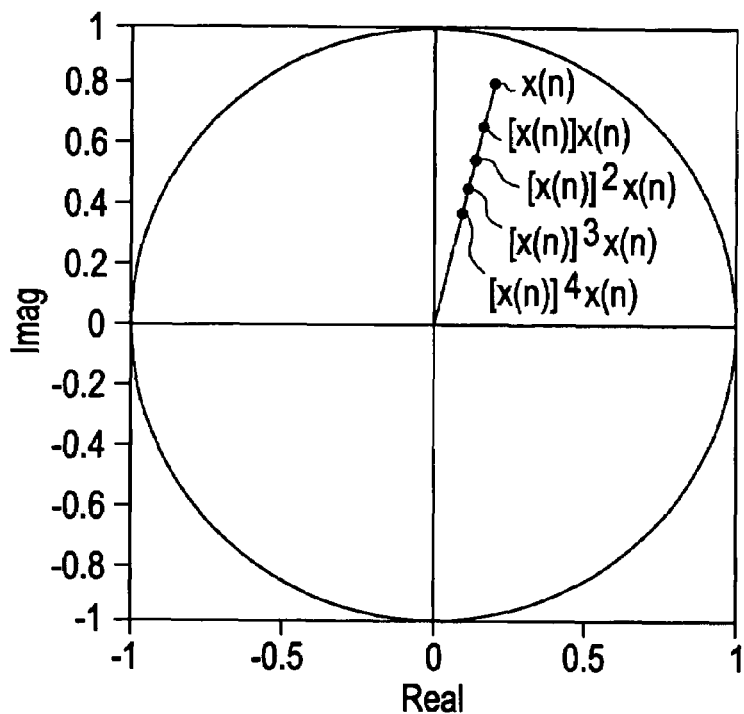
FIG. 2 illustrates the scaled relationship of the 5 elements in vector $\underline{x}(n)$, where $\underline{x}(n)=0.2+i0.8$.
Figure 3:
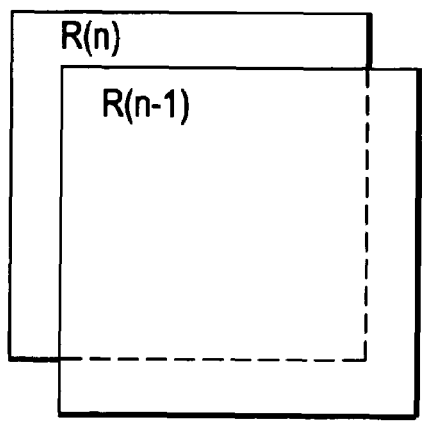
FIG. 3 graphically demonstrates that most of the elements in matrix $\underline{R}(n)$ are the same elements in matrix $\underline{R}(n-1)$.

The present invention provides methodologies for reducing the computation complexity of the pre-distorting operation discussed in detail above. To better understand the methodologies of the present invention, the operations for complex and scalar multiplications will be reviewed, and then the methodologies of the present invention will be described by examining the correlation matrix and the cross-correlation vector.

Complex and Scalar Multiplications

The basic operation to construct a correlation matrix is repeatedly multiplying two complex numbers and adding the result to accumulators. With the direct approach, each complex-complex multiplication requires 4 multiplications and 2 additions. An example of this is shown below:

$$(a+ib) \cdot (c+id) = (a \cdot c - b \cdot d) + i(a \cdot c + b \cdot d)$$

Using this example, the distortion model will be analyzed and the scalar terms in the correlation matrix and cross-correlation vector identified. The general complex-complex multiplications will then be converted to scalar-complex multiplications or scalar-scalar multiplications according to methodologies of the present invention to reduce the computation complexity. The following are some guidelines:

Sum of squares—Whenever a magnitude square is encountered, the sum-of-squares operation will be used, since this (e.g., $|a+ib|^2=a\cdot a+b\cdot b$) requires only 2 multiplications and 1 addition.

Scalar-complex multiplication—If one of the numbers is a scalar, scalar-complex multiplication will be used, since this (e.g., $(a+ib)\cdot c=a\cdot c+ib\cdot c$) requires only 2 multiplications.

Scalar-scalar multiplication—If both numbers are scalar, scalar-scalar multiplication will be used, since this requires only 1 multiplication.

Table 4 below summarizes the complexity of different multiplications:

TABLE 4

| Multiplication Operations | Equations | #Mult | #Add |
|---|---|---|---|
| Complex-complex | $(a + ib) \cdot (c + id) = (a \cdot c - b \cdot d) + i(a \cdot c + b \cdot d)$ | 4 | 2 |
| Sum of squares | $|a + ib|^2 = a \cdot a + b \cdot b$ | 2 | 1 |
| Scalar-complex | $(a + ib) \cdot c = a \cdot c + ib \cdot c$ | 2 | 0 |
| Scalar-scalar | $a \cdot b$ | 1 | 0 |

Correlation Matrix

Reducing the computation complexity for determining the correlation matrix will be discussed first. The correlation matrix includes two types of blocks: Type 1 or diagonal blocks, and Type 2 or off-diagonal blocks.

Type 1 (Diagonal) Blocks

The correlation matrix has L=6 diagonal blocks. Without loss of generality, handling the first diagonal block $\underline{R}_{1,1}(n)$ will be described in detail and handling of the other diagonal blocks will be readily understood from this discussion. It will be shown that the K·K=25 elements in diagonal block $\underline{R}_{1,1}(n)$ are real-valued and can be represented by 9 polynomial terms.

Letting $a=|x(n)|$, we have:

$$\underline{x}(n) = \begin{bmatrix} 1 \\ a \\ a^2 \\ a^3 \\ a^4 \end{bmatrix} x(n).$$

Diagonal block $\underline{R}_{1,1}(n)$ is the auto-correlation block of $\underline{x}(n)$ and includes real valued elements as shown below:

$$\underline{R}_{1,1}(n) = \underline{x}(n)\underline{x}^H(n)$$

$$= \begin{bmatrix} 1 \\ a \\ a^2 \\ a^3 \\ a^4 \end{bmatrix} \begin{bmatrix} 1 & a & a^2 & a^3 & a^4 \end{bmatrix} x(n)\cdot x^*(n)$$

$$= \begin{bmatrix} a^2 & a^3 & a^4 & a^5 & a^6 \\ a^3 & a^4 & a^5 & a^6 & a^7 \\ a^4 & a^5 & a^6 & a^7 & a^8 \\ a^5 & a^6 & a^7 & a^8 & a^9 \\ a^6 & a^7 & a^8 & a^9 & a^{10} \end{bmatrix}$$

Notice that $a^2=|x(n)|^2=x(n)\cdot x^*(n)$.

Therefore, there are only 9 distinct real values $\{a^2, a^3, a^4, \ldots, a^9 \text{ and } a^{10}\}$ in the block. These polynomial terms can be obtained sequentially. Using these properties the computation complexity may be reduced.

Figure 4:
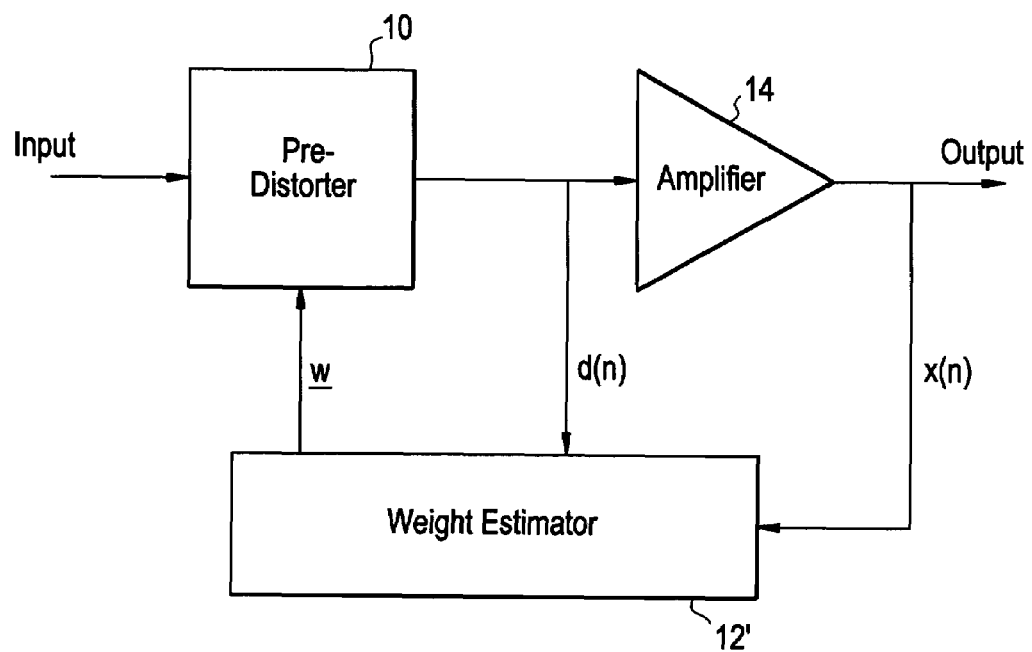
FIG. 4 illustrates the architecture for digital predistortion to correct amplifier distortion according to an example embodiment of the present invention.

The following is the procedure performed at the weight estimator 12' of FIG. 4 according to an embodiment of the present invention to compute the elements in diagonal block $\underline{R}_{1,1}(n)$:

1. Compute $a^2$, using sum-of-squares operation, where $a^2=|x(n)|^2=(\text{real}(x(n)))^2+(\text{imag}(x(n)))^2$.
2. Compute $a=\text{sqrt}(a^2)$ and store value a along with $x(n)$.
3. Sequentially compute $a^3, a^4, \ldots, a^9$ and $a^{10}$, by multiplying the previous number by a, using scalar-scalar multiplications.

The computation complexity, excluding the square-root operation, is summarized below in table 5. The baseline given in this and other tables is for the prior art methodology discussed in detail in the Background of the Invention section:

TABLE 5

| Operations | #Mult | #Add |
|---|---|---|
| $a^2$, Sum of squares | 2 | 1 |
| $a^3, a^4, \ldots, a^9$ and $a^{10}$ | 8 | 0 |
| Total | 10 | 1 |
| Baseline: 15 complex-complex multiplications | 60 | 30 |

Type 2 (Off-Diagonal) Blocks

Without loss of generality, handling of off-diagonal block $\underline{R}_{1,2}(n)$ will be described in detail, and the handling of other off-diagonal blocks will be readily apparent from this discussion. Letting $a=|x(n)|$ and $b=|x(n-1)|$, we have:

$$\underline{x}(n) = \begin{bmatrix} 1 \\ a \\ a^2 \\ a^3 \\ a^4 \end{bmatrix} x(n) \text{ and } \underline{x}(n-1) = \begin{bmatrix} 1 \\ b \\ b^2 \\ b^3 \\ b^4 \end{bmatrix} x(n-1).$$

The off-diagonal block becomes:

$$\underline{R}_{1,2}(n) = \underline{x}(n)\underline{x}^H(n-1)$$

-continued $$= \begin{bmatrix} 1 & b & b^2 & b^3 & b^4 \\ a & ab & ab^2 & ab^3 & ab^4 \\ a^2 & a^2b & a^2b^2 & a^2b^3 & a^2b^4 \\ a^3 & a^3b & a^3b^2 & a^3b^3 & a^3b^4 \\ a^4 & a^4b & a^4b^2 & a^4b^3 & a^4b^4 \end{bmatrix} x(n) \cdot x^*(n-1)$$

Therefore, the only complex-complex multiplication that is computed is the first element $x(n) \cdot x^*(n-1)$ in the block. The rest of the terms may be obtained sequentially using scalar-complex multiplications.

The following is the procedure the weight estimator 12' performs according to an embodiment of the present invention to compute elements in the off-diagonal block $\underline{R}_{1,2}(n)$:

1. Compute the first element of $\underline{R}_{1,2}(n)$, $x(n) \cdot x^*(n-1)$, using a complex-complex multiplication.
2. Compute the remaining elements (or terms) in the first row sequentially, by repeatedly multiplying the previous element by b, using scalar-complex multiplications.
3. Compute the remaining rows sequentially, by repeatedly multiplying the previous row by a, using scalar-complex multiplications.

The computation complexity is summarized below in table 6 below:

TABLE 6

| Operations | #Mult | #Add |
| --- | --- | --- |
| 1 complex-complex multiplication | 4 | 2 |
| 24 scalar-complex multiplications | 48 | 0 |
| Total | 52 | 2 |
| Baseline: 25 complex-complex multiplications | 100 | 50 |

The magnitude $b = |x(n-1)|$ may be computed and stored at the weight estimator 12' while computing diagonal block $\underline{R}_{1,1}(n-1)$ at time n−1. Accordingly, there is no need to repeat the square-root operation.

The following tables summarize the reduction in computation complexity for the improved algorithm. If we compute the 465 elements in the upper triangular correlation matrix according to the symmetry property, the complexity reduction is summarized in the following table:

TABLE 7

| Operations | #Mult | #Add |
| --- | --- | --- |
| 6 diagonal blocks | 60 | 6 |
| 15 off-diagonal blocks | 780 | 30 |
| Total | 840 | 36 |
| Baseline: 465 complex-complex multiplications | 1860 | 930 |

If we compute only the 140 elements in the top block row of the correlation matrix according to the delayed version property, the complexity reduction is summarized in the following table:

TABLE 8

| Operations | #Mult | #Add |
| --- | --- | --- |
| 1 diagonal block | 10 | 1 |
| 5 off-diagonal blocks | 260 | 10 |
| Total | 270 | 12 |
| Baseline: 140 complex-complex multiplications | 560 | 280 |

In both cases, more than one half of the computation complexity can be reduced.

Cross Correlation Vector

Next, reducing the computation complexity for determining the cross correlation vector will be described.

The cross correlation vector at time n is:

$$\underline{v}(n) = d(n) \cdot \underline{u}(n)$$

$$= \begin{bmatrix} d(n) \cdot \underline{x}(n) \\ d(n) \cdot \underline{x}(n-1) \\ d(n) \cdot \underline{x}(n-2) \\ d(n) \cdot \underline{x}(n-3) \\ d(n) \cdot \underline{x}(n-4) \\ d(n) \cdot \underline{x}(n-5) \end{bmatrix}.$$

Let $a_l = |x(n-l)|$, $0 \leq l \leq 5$, then each cross correlation vector block $d(n) \cdot \underline{x}(n-l)$ may be expressed as:

$$d(n) \cdot \underline{x}(n-l) = \begin{bmatrix} 1 \\ a_l \\ a_l^2 \\ a_l^3 \\ a_l^4 \end{bmatrix} d(n) \cdot x(n-l), \quad 0 \leq l \leq 5.$$

Within this block, complex-complex multiplication is used once to compute $d(n) \cdot x(n-l)$, and the remaining 4 elements are obtained, sequentially, by multiplying the previous element by $a_l$, using scalar-complex multiplication. Note that $a_l$, $0 \leq l \leq 5$ may be computed and stored before and does not need to be computed again.

The following is the procedure performed by the weight estimator 12' according to an example embodiment of the present invention to compute the cross-correlation vector:

Repeating for $0 \leq l \leq 5$,
1. Compute $v_{5l+1}(n) = d(n) \cdot x(n-l)$, using complex-complex multiplication.
2. Compute $v_{5l+2}(n), \ldots, v_{5l+5}(n)$, sequentially, by multiplying the previous element by $a_l$, using scalar-complex multiplication.

The computation complexity is summarized below in table 7:

TABLE 9

| Operations | #Mult | #Add |
|---|---|---|
| 6 complex-complex multiplications | 24 | 12 |
| 24 scalar-complex multiplications | 48 | 0 |
| Total | 72 | 12 |
| Baseline: 30 complex-complex multiplications | 120 | 60 |

Improved Method with Cross Terms

Next, cross-polynomial terms will be considered, and it will be shown that the same techniques of the present invention may be used to reduce computation complexity. Cross-polynomial terms account for correlation between polynomial terms from different delay times, and may improve the effectiveness of the distortion modeling.

Consider the products $|x(n-m)|^2 x(n)$ and $|x(n-m)|^4 x(n)$, $1 \leq m \leq 12$, which are the cross product between a current sample and a magnitude-polynomial at a different sample time. Let $b_m^2 = |x(n-m)|^2$ and $b_m^4 = |x(n-m)|^4$. Two cross term vectors $\underline{y}(n)$ and $\underline{z}(n)$ may be defined as:

$$\underline{y}(n) = \begin{bmatrix} |x(n-1)|^2 \\ |x(n-2)|^2 \\ |x(n-3)|^2 \\ \vdots \\ |x(n-12)|^2 \end{bmatrix} x(n) = \begin{bmatrix} b_1^2 \\ b_2^2 \\ b_3^2 \\ \vdots \\ b_{12}^2 \end{bmatrix} x(n)$$

$$\underline{z}(n) = \begin{bmatrix} |x(n-1)|^4 \\ |x(n-2)|^4 \\ |x(n-3)|^4 \\ \vdots \\ |x(n-12)|^4 \end{bmatrix} x(n) = \begin{bmatrix} b_1^4 \\ b_2^4 \\ b_3^4 \\ \vdots \\ b_{12}^4 \end{bmatrix} x(n)$$

The cross term vectors $\underline{y}(n)$ and $\underline{z}(n)$ are appended to the concatenated amplifier output signal vector $\underline{u}(n)$ as shown below:

$$\underline{u}(n) = \begin{bmatrix} \underline{x}(n) \\ \underline{x}(n-1) \\ \underline{x}(n-2) \\ \underline{x}(n-3) \\ \underline{x}(n-4) \\ \underline{x}(n-5) \\ \underline{y}(n) \\ \underline{z}(n) \end{bmatrix} = \begin{bmatrix} u_1(n) \\ u_2(n) \\ u_3(n) \\ u_4(n) \\ \vdots \\ u_{53}(n) \\ u_{54}(n) \end{bmatrix}.$$

Note that with the cross terms, there are $M=KL+12+12=54$ elements in the input signal vector $u(n)$. This assumes that $b_m^2$ and $b_m^4$ were computed and stored by the weight estimator 12' while computing diagonal block $R_{1,1}(n-m)$ at time $n-m$ for $m=1, 2, \ldots, 12$. It is also assumed that $a^2=|x(n)|^2$ was already computed and stored for use by the weight estimator 12'.

Correlation Matrix

Reducing the computation complexity for determining the correlation matrix including cross polynomial terms will now be described. The expanded correlation matrix becomes:

$$\underline{R}(n) = \begin{bmatrix} R_{1,1}(n) & R_{1,2}(n) & R_{1,3}(n) & R_{1,4}(n) & R_{1,5}(n) & R_{1,6}(n) & R_{1,7}(n) & R_{1,8}(n) \\ R_{2,1}(n) & R_{2,2}(n) & R_{2,3}(n) & R_{2,4}(n) & R_{2,5}(n) & R_{2,6}(n) & R_{2,7}(n) & R_{2,8}(n) \\ R_{3,1}(n) & R_{3,2}(n) & R_{3,3}(n) & R_{3,4}(n) & R_{3,5}(n) & R_{3,6}(n) & R_{3,7}(n) & R_{3,8}(n) \\ R_{4,1}(n) & R_{4,2}(n) & R_{4,3}(n) & R_{4,4}(n) & R_{4,5}(n) & R_{4,6}(n) & R_{4,7}(n) & R_{4,8}(n) \\ R_{5,1}(n) & R_{5,2}(n) & R_{5,3}(n) & R_{5,4}(n) & R_{5,5}(n) & R_{5,6}(n) & R_{5,7}(n) & R_{5,8}(n) \\ R_{6,1}(n) & R_{6,2}(n) & R_{6,3}(n) & R_{6,4}(n) & R_{6,5}(n) & R_{6,6}(n) & R_{6,7}(n) & R_{6,8}(n) \\ R_{7,1}(n) & R_{7,2}(n) & R_{7,3}(n) & R_{7,4}(n) & R_{6,5}(n) & R_{7,6}(n) & R_{7,7}(n) & R_{7,8}(n) \\ R_{8,1}(n) & R_{8,2}(n) & R_{8,3}(n) & R_{8,4}(n) & R_{6,5}(n) & R_{8,6}(n) & R_{8,7}(n) & R_{8,8}(n) \end{bmatrix}$$

It will be appreciated that each block $R_{i,j}(n)$ for $i=1, \ldots, 6$ and $j=1, \ldots, 6$ is a 5×5 matrix and cross-polynomial terms were not included in the vector $u(n)$ as discussed above. Accordingly, these Type 1 and Type 2 blocks may be computed as discussed above, and only the computation of the blocks in the last two row and last two columns will be described in detail. The last two columns and last two rows have different sizes than the first 36 blocks. For example, diagonal blocks $R_{7,7}(n)$ and $R_{8,8}(n)$ are 12×12 matrices, and off-diagonal blocks $R_{1,7}(n)$ and $R_{1,8}(n)$ are 5×12 matrices.

From the symmetry property, only the upper triangular blocks within the last two columns need to be considered. These 15 blocks can be grouped into 4 further types where the blocks in each type have the same structure as set forth in table 8 below (it will be recalled that block Types 1 and 2 were discussed above):

TABLE 10

| Type # | Blocks in this type | Dim | # | Example Expression |
|---|---|---|---|---|
| 3 | $R_{1,7}(n), R_{1,8}(n)$ | 5 × 12 | 2 | $R_{1,7}(n) = x(n) \cdot y^H(n)$ |
| 4 | $R_{2,7}(n), \ldots, R_{6,7}(n)$ | 5 × 12 | 10 | $R_{2,7}(n) = x(n-1) \cdot y^H(n)$ |

TABLE 10-continued

| Type # | Blocks in this type | Dim | Example # | Expression |
|---|---|---|---|---|
| | and $R_{2,8}(n), \ldots, R_{6,8}(n)$ | | | |
| 5 | $R_{7,7}(n), R_{8,8}(n)$ | 12 × 12 | 2 | $R_{7,7}(n) = y(n) \cdot y^H(n)$ |
| 6 | $R_{7,8}(n)$ | 12 × 12 | 1 | $R_{7,8}(n) = y(n) \cdot z^H(n)$ |

Type 3 Blocks

Consider block $\underline{R}_{1,7}(n)$ shown below:

$$\underline{R}_{1,7} = x(n) \cdot \underline{y}^H(n) = \begin{bmatrix} 1 \\ a \\ a^2 \\ a^3 \\ a^4 \end{bmatrix} [b_1^2 \ b_2^2 \ b_3^2 \ \ldots \ b_{12}^2] x(n) \cdot x^*(n)$$

$$= \begin{bmatrix} b_1^2 & b_2^2 & b_3^2 & \ldots & b_{12}^2 \\ ab_1^2 & ab_2^2 & ab_3^2 & \ldots & ab_{12}^2 \\ a^2b_1^2 & a^2b_2^2 & a^2b_3^2 & \ldots & a^2b_{12}^2 \\ a^3b_1^2 & a^3b_2^2 & a^3b_3^2 & \vdots & a^3b_{12}^2 \\ a^4b_1^2 & a^4b_2^2 & a^4b_3^2 & \ldots & a^4b_{12}^2 \end{bmatrix} a^2$$

Hence all 60 elements are real-valued.

The following is the procedure performed at the weight estimator 12' according to an embodiment of the present invention to compute the elements in block $\underline{R}_{1,7}(n)$:

1. Compute the first row, using one scalar-scalar multiplication for each $b_m^2 \cdot a^2$
2. Compute the remaining rows sequentially, by multiplying a previous row by a using one scalar-scalar multiplication per element.

The computation complexity is summarized below in table 9:

TABLE 11

| Operations | #Mult | #Add |
|---|---|---|
| 60 scalar-scalar multiplications | 60 | 0 |
| Subtotal | 60 | 0 |
| Total 2 blocks | 120 | 0 |
| Baseline: 2 × 60 complex-complex multiplications | 480 | 240 |

Type 4 Blocks

Consider block $\underline{R}_{2,7}(n)$ where $a_1 = |x(n-1)|$ shown below:

$$\underline{R}_{2,7} = x(n-1) \cdot \underline{y}^H(n) = \begin{bmatrix} 1 \\ a_1 \\ a_1^2 \\ a_1^3 \\ a_1^4 \end{bmatrix} [b_1^2 \ b_2^2 \ b_3^2 \ \ldots \ b_{12}^2] x(n-1) \cdot x^*(n)$$

$$= \begin{bmatrix} b_1^2 & b_2^2 & b_3^2 & \ldots & b_{12}^2 \\ a_1b_1^2 & a_1b_2^2 & a_1b_3^2 & \ldots & a_1b_{12}^2 \\ a_1^2b_1^2 & a_1^2b_2^2 & a_1^2b_3^2 & \ldots & a_1^2b_{12}^2 \\ a_1^3b_1^2 & a_1^3b_2^2 & a_1^3b_3^2 & \vdots & a_1^3b_{12}^2 \\ a_1^4b_1^2 & a_1^4b_2^2 & a_1^4b_3^2 & \ldots & a_1^4b_{12}^2 \end{bmatrix} x(n-1) \cdot x^*(n)$$

Hence, only one complex-complex multiplication is computed for all 60 elements. The following is the procedure performed by the weight estimator 12' to compute the elements in block $\underline{R}_{2,7}(n)$:

1. Compute $x(n-1) \cdot x^*(n)$, using one complex-complex multiplication. Note that the conjugate of this term may be computed and stored while computing $\underline{R}_{1,2}(n)$.
2. Compute the first row, by multiplying $x(n-1) \cdot x^*(n)$ by $b_m^2$, using one scalar-complex multiplication per element.
3. Compute the remaining rows sequentially, by multiplying a previous row by $a_1$ using one scalar-complex multiplication per element.

The computation complexity is summarized below in table 10:

TABLE 12

| Operations | #Mult | #Add |
|---|---|---|
| 1 complex-complex multiplication | 4 | 2 |
| 60 scalar-complex multiplications | 120 | 0 |
| Subtotal | 124 | 2 |
| Total 10 blocks | 1240 | 20 |
| Baseline: 10 × 60 complex-complex multiplications | 2400 | 1200 |

Type 5 Blocks

Consider block $\underline{R}_{7,7}(n)$ shown below:

$$\underline{R}_{7,7} = \underline{y}(n) \cdot \underline{y}^H(n) = \begin{bmatrix} b_1^2 \\ b_2^2 \\ b_3^2 \\ \vdots \\ b_{12}^2 \end{bmatrix} [b_1^2 \ b_2^2 \ b_3^2 \ \ldots \ b_{12}^2] x(n) \cdot x^*(n)$$

$$= \begin{bmatrix} b_1^2b_1^2 & b_1^2b_2^2 & b_1^2b_3^2 & \ldots & b_1^2b_{12}^2 \\ b_2^2b_1^2 & b_2^2b_2^2 & b_2^2b_3^2 & \ldots & b_2^2b_{12}^2 \\ b_3^2b_1^2 & b_3^2b_2^2 & b_3^2b_3^2 & \ldots & b_3^2b_{12}^2 \\ \vdots & \vdots & \vdots & \vdots & \vdots \\ b_{12}^2b_1^2 & b_{12}^2b_2^2 & b_{12}^2b_3^2 & \ldots & b_{12}^2b_{12}^2 \end{bmatrix} a^2$$

All elements in the block are real valued. From the symmetry property, only the 78 (=12·13/2) upper triangle elements need to be computed. For each of these elements, the term $b_i^2 \cdot b_j^2 \cdot a^2$ is computed, which requires 2 scalar-scalar multiplications. The computation complexity is summarized below in table 11:

TABLE 13

| Operations | #Mult | #Add |
|---|---|---|
| 78 double scalar multiplications | 156 | 0 |
| Subtotal | 156 | 0 |
| Total 2 blocks | 312 | 0 |
| Baseline: 2 × 78 complex-complex multiplications | 624 | 312 |

Type 6 Block

Consider block $\underline{R}_{7,8}$ shown below:

$$\underline{R}_{7,8} = \underline{y}(n) \cdot \underline{z}^H(n) = \begin{bmatrix} b_1^2 \\ b_2^2 \\ b_3^2 \\ \vdots \\ b_{12}^2 \end{bmatrix} [b_1^4 \ b_2^4 \ b_3^4 \ \ldots \ b_{12}^4] x(n) \cdot x^*(n)$$

$$= \begin{bmatrix} b_1^2 b_1^4 & b_1^2 b_2^4 & b_1^2 b_3^4 & \ldots & b_1^2 b_{12}^4 \\ b_2^2 b_1^4 & b_2^2 b_2^4 & b_2^2 b_3^4 & \ldots & b_2^2 b_{12}^4 \\ b_3^2 b_1^4 & b_3^2 b_2^4 & b_3^2 b_3^4 & \ldots & b_3^2 b_{12}^4 \\ \vdots & \vdots & \vdots & \vdots & \vdots \\ b_{12}^2 b_1^4 & b_{12}^2 b_2^4 & b_{12}^2 b_3^4 & \ldots & b_{12}^2 b_{12}^4 \end{bmatrix} a^2$$

All 144 elements in the block are real valued. For each of these elements, the term $b_i^2 \cdot b_j^4 \cdot a^2$ is computed, which requires 2 scalar-scalar multiplications. The computation complexity is summarized below in table 12:

TABLE 14

| Operations | #Mult | #Add |
|---|---|---|
| 144 double scalar-scalar multiplications | 288 | 0 |
| Total | 288 | 0 |
| Baseline: 144 complex-complex multiplications | 576 | 288 |

Computation Complexity

The section will summarize the reduction in computation complexity, in the correlation matrix, for the improved methodology with cross terms. There are 1485 (=54*55/2) elements in the upper triangular correlation matrix. The complexity is summarized below in table 13:

TABLE 15

| Operations | #Mult | #Add |
|---|---|---|
| Type 1 (diagonal) blocks (6) | 60 | 6 |
| Type 2 (off-diagonal) blocks (15) | 780 | 30 |
| Type 3 blocks (2) | 120 | 0 |
| Type 4 blocks (10) | 1240 | 20 |
| Type 5 blocks (2) | 312 | 0 |
| Type 6 block (1) | 288 | 0 |
| Total | 2800 | 56 |
| Baseline: 1485 complex-complex multiplications | 5940 | 2970 |

Cross Correlation Vector

Next, reducing the computation complexity for determining the cross correlation vector will be described. The cross correlation vector at time n is:

$$\underline{v}(n) = d(n) \cdot \underline{u}(n) = \begin{bmatrix} d(n) \cdot \underline{x}(n) \\ d(n) \cdot \underline{x}(n-1) \\ d(n) \cdot \underline{x}(n-2) \\ d(n) \cdot \underline{x}(n-3) \\ d(n) \cdot \underline{x}(n-4) \\ d(n) \cdot \underline{x}(n-5) \\ d(n) \cdot \underline{y}(n) \\ d(n) \cdot \underline{z}(n) \end{bmatrix}.$$

where $$d(n) \cdot \underline{y}(n) = \begin{bmatrix} b_1^2 \cdot d(n) \cdot x(n) \\ b_2^2 \cdot d(n) \cdot x(n) \\ b_3^2 \cdot d(n) \cdot x(n) \\ \vdots \\ b_{12}^2 \cdot d(n) \cdot x(n) \end{bmatrix} = \begin{bmatrix} b_1^2 \\ b_2^2 \\ b_3^2 \\ \vdots \\ b_{12}^2 \end{bmatrix} d(n) \cdot x(n) \text{ and}$$

$$d(n) \cdot \underline{z}(n) = \begin{bmatrix} b_1^2 \cdot b_1^2 \cdot d(n) \cdot x(n) \\ b_2^2 \cdot b_2^2 \cdot d(n) \cdot x(n) \\ b_3^2 \cdot b_3^2 \cdot d(n) \cdot x(n) \\ \vdots \\ b_{12}^2 \cdot b_{12}^2 \cdot d(n) \cdot x(n) \end{bmatrix}.$$

For $0 \leq l \leq 5$, the computation of each cross correlation vector block $d(n) \cdot \underline{x}(n-l)$ was discussed in detail above. Accordingly, on the computation of the cross correlation vector blocks with cross term will be described in detail.

First $d(n) \cdot \underline{y}(n)$ is computed, and then is used to compute $d(n) \cdot \underline{z}(n)$. To compute $d(n) \cdot \underline{y}(n)$, a complex-complex multiplication is used once to compute $d(n) \cdot x(n)$. Then, the elements $b_l^2 \cdot d(n) \cdot x(n)$ and $b_l^2 \cdot b_l^2 \cdot d(n) \cdot x(n)$ for $1 \leq l \leq 12$ are obtained using scalar-complex multiplication.

The following is the sequence performed by the weight estimator 12' according to an embodiment of the present invention to compute the cross-correlation vector for $\underline{y}(n)$ and $\underline{z}(n)$ sections:

1. Compute $d(n) \cdot x(n)$, using complex-complex multiplication.
2. Compute $b_l^2 \cdot d(n) \cdot x(n)$ and then $b_l^2 b_l^2 \cdot d(n) \cdot x(n)$, using scalar-complex multiplication, for $1 \leq l \leq 12$.

The computation complexity is summarized below in table 14:

TABLE 16

| Operations | #Mult | #Add |
|---|---|---|
| x(n) sections | | |
| 6 complex-complex multiplications | 24 | 12 |
| 24 scalar-complex multiplications | 48 | 0 |
| y(n) and z(n) sections | | |
| 1 complex-complex multiplication | 4 | 2 |

TABLE 16-continued

| Operations | #Mult | #Add |
|---|---|---|
| 24 scalar-complex multiplications | 48 | 0 |
| Total | 124 | 14 |
| Baseline: 54 complex-complex multiplications | 216 | 108 |

The present invention provides methodologies to reduce the computation complexity for digital pre-distortion. As demonstrated above, more than half the correlation computation may be reduced.

The invention being thus described, it will be obvious that the same may be varied in many ways. For example, while mentioned as applicable to digital pre-distortion for RF amplifiers, the present invention is also application to pre-distortion for other types of amplifiers. Furthermore, the computation reduction techniques discussed above for the different types of blocks and cross correlation vectors may be used together or may be used independently of each other. In other words, the computation reduction technique for only one type of block may be used. Such variations are not to be regarded as a departure from the invention, and all such modifications are intended to be included within the scope of the invention.

I claim:

1. A method of pre-distorting a signal for input to an amplifier, comprising:
    generating a weight vector based on a pre-distorted input signal and an output signal of the amplifier using a computation reduction technique; and
    pre-distorting an input signal for input to an amplifier based on the generated weight vector; and
    wherein the computation reduction technique decomposes a number of multiplication operations between complex numbers such that a total number of multiplications and a total number of additions to generate the weight vector is reduced as compared to if the number of multiplication operations between complex numbers was not decomposed.

2. The method of claim 1, wherein the generating step comprises:
    computing a correlation diagonal block derived from one of the output signal and a previous output signal, a first term of the vector being a complex number and having a magnitude, and each subsequent term of the vector being obtained by multiplying the first term by a result of raising the magnitude to a respective exponential order.

3. The method of claim 2, wherein the computing step comprises:
    computing a square of the first term to obtain a first scalar value;
    computing a square root of the square to obtain a second scalar value;
    using scalar multiplication and the first and second scalar values to obtain elements in the diagonal block.

4. The method of claim 1, wherein the generating step comprises:
    computing a correlation off-diagonal block derived from a first vector and a second vector,
        the first vector derived from one of the output signal and a previous output signal, a first term of the vector being a complex number and having a magnitude, and each subsequent term of the first vector being obtained by multiplying the first term by a result of raising the magnitude to a respective exponential order, and
        the second vector derived from a previous output signal, and a first term of the second vector being a previous first term of the first vector.

5. The method of claim 4, wherein the computing step comprises:
    computing a first element of a first row of the off-diagonal block as the first term of the first vector times a complex conjugate of the first term of the second vector;
    computing remaining elements of the first row of the off-diagonal block using scalar-complex multiplication, the first element and a magnitude of the first term of the second vector;
    computing each subsequent row of the off-diagonal block using scalar-complex multiplication, a previous row of the off-diagonal block, and the magnitude of the first term of the first vector.

6. The method of claim 1, wherein the generating step comprises:
    computing a cross correlation vector block derived from the pre-distorted input signal and a vector, the vector obtained from one of the output signal and a previous output signal, a first term of the vector being a complex number and having a magnitude, and each subsequent term of the vector being obtained by multiplying the first term by a result of raising the magnitude to a respective exponential order.

7. The method of claim 6, wherein the computing step comprises:
    computing a first element of the cross-correlation vector block as the pre-distortion input signal times the first term; and
    computing a number of subsequent elements of the cross-correlation block using scalar multiplication a previous term and the magnitude of the first term.

8. The method of claim 1, wherein the generating step comprises:
    computing an off-diagonal cross correlation block derived from a first vector and a second vector,
        the first vector derived from one of the output signal and a previous output signal as a first term, a first term of the vector being a complex number and having a magnitude, and each subsequent term of the vector being obtained by multiplying the first term by a result of raising the magnitude to a respective exponential order, and
        each term of the second vector derived from a different previous output signal and the output signal.

9. The method of claim 8, wherein the computing step comprises:
    computing a square of the first term to obtain a first scalar value;
    computing a square of each term in the second vector to obtain a set of second scalar values; and
    using scalar multiplication, the first scalar value and the set of second scalar values to obtain elements in the off-diagonal cross correlation block.

10. The method of claim 1, wherein the generating step comprises:
    computing an off-diagonal cross correlation block derived from a first and a second vector,
        each term of the first vector being a different previous output signal squared times the output signal, and
        each term of the second vector being a square of a corresponding term in the first vector.

11. The method of claim 10, wherein the computing step comprises:

computing a square of each different previous output signal to obtain a first set of scalar values;

computing a square of each value in the first set of scalar values to obtain a second set of scalar values;

computing a square of the output signal to obtain a third scalar value; and using scalar multiplication, the first set of scalar value, the second set of scalar value and the third scalar value to obtain the elements of the off-diagonal cross-correlation block.

12. The method of claim 1, wherein the generating step comprises:

computing a diagonal cross-correlation block derived from a first vector, each term of the first vector being a different previous output signal squared times the output signal.

13. The method of claim 12, wherein the computing step comprises:

computing a square of each different previous output signal to obtain a first set of scalar values;

computing a square of the output signal to obtain a second scalar value; and using scalar multiplication, the first set of scalar values and the second scalar value to obtain the elements of the diagonal cross-correlation block.

14. The method of claim 1, wherein the generating step comprises:

computing a cross correlation vector block derived from the pre-distorted input signal and a first vector, each term of the first vector being a different previous output signal squared times the output signal.

15. The method of claim 14, wherein the computing step comprises:

compute the pre-distortion input signal times the output signal to obtain a complex value;

compute the square of each different previous output signal to obtain a set of scalar values; and using scalar-complex multiplication, the complex value and the set of scalar values to obtain elements of the cross correlation vector block.

16. The method of claim 1, wherein the generating step comprises:

computing a cross correlation vector block derived from the pre-distorted input signal and a first vector, each term of the first vector being a different previous output signal quadrupled times the output signal.

17. The method of claim 14, wherein the computing step comprises:

compute the pre-distortion input signal times the output signal to obtain a complex value;

compute the square of each different previous output signal to obtain a set of scalar values; and using scalar-complex multiplication, the complex value and the set of scalar values to obtain elements of the cross correlation vector block.

* * * * *